(12) United States Patent
Liu et al.

(10) Patent No.: US 11,139,149 B2
(45) Date of Patent: Oct. 5, 2021

(54) GAS INJECTOR

(71) Applicant: Taiwan Semiconductor Manufacturing Co., Ltd., Hsin-Chu (TW)

(72) Inventors: Yan-Hong Liu, Zhudong Township, Hsinchu County (TW); Ming-Feng Chen, Hinchu (TW); Li-Shi Liu, Hinchu (TW); Che-Fu Chen, Hinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 55 days.

(21) Appl. No.: 16/104,816

(22) Filed: Aug. 17, 2018

(65) Prior Publication Data
US 2019/0164724 A1 May 30, 2019

Related U.S. Application Data

(60) Provisional application No. 62/592,211, filed on Nov. 29, 2017.

(51) Int. Cl.
*H01J 37/32* (2006.01)
*C23C 16/455* (2006.01)

(52) U.S. Cl.
CPC ........ *H01J 37/3244* (2013.01); *C23C 16/455* (2013.01); *C23C 16/45563* (2013.01); *C23C 16/45565* (2013.01); *C23C 16/45578* (2013.01); *C23C 16/45591* (2013.01); *H01J 37/321* (2013.01)

(58) Field of Classification Search
None
See application file for complete search history.

(56) References Cited

U.S. PATENT DOCUMENTS

| 4,520,757 A * | 6/1985 | Nath ..................... C23C 16/455 |
| | | 118/718 |
| 5,870,488 A | 2/1999 | Rush et al. |
| 2004/0149701 A1* | 8/2004 | Gonzalez .......... H01J 37/32449 |
| | | 219/121.51 |
| 2011/0098841 A1* | 4/2011 | Tsuda ................ C23C 16/45565 |
| | | 118/728 |
| 2012/0247673 A1* | 10/2012 | Hayashi ............ C23C 16/45563 |
| | | 156/345.33 |

(Continued)

FOREIGN PATENT DOCUMENTS

CN 103140914 A 6/2013

*Primary Examiner* — Binu Thomas
(74) *Attorney, Agent, or Firm* — Duane Morris LLP

(57) ABSTRACT

Disclosed is a gas injector for a semiconductor processing system comprising a tube, and at least one nozzle head mounted on a downstream end of the tube wherein the at least one nozzle allows a fluid communication to discharge a gas from a upstream end of the tube through the at least one nozzle of the gas injector to ambient atmosphere surrounding the downstream end of the tube, wherein the at least one nozzle comprises: a body, and at least one adaptor comprising a plurality of flow regulation components to alter a flow direction of the gas at the downstream end, wherein the plurality of flow regulation components are each constructed and arranged such that a film buildup on inner surfaces of the gas injector is reduced.

18 Claims, 13 Drawing Sheets

(56) References Cited

U.S. PATENT DOCUMENTS

2013/0008382 A1* 1/2013 Hattori .............. C23C 16/45544
                                                                118/728
2013/0028691 A1   1/2013 Tabrizi et al.

* cited by examiner

TOP VIEW

GAS INJECTOR

CROSS-REFERENCE TO RELATED APPLICATION

The present application claims priority to U.S. Provisional Patent Application No. 62/592,211, filed on Nov. 29, 2017, which is incorporated by reference herein in its entirety.

BACKGROUND

Semiconductor processing involves a number of different chemical and physical processes. The integrated circuits are constructed using multilayers of interrelated patterns of various materials; layers of material are created by chemical vapor deposition (CVD), physical vapor deposition (PVD), and/or epitaxial growth. Some of the layers are patterned using photoresist masks and wet and dry etching techniques. As integrated circuits continue to increase in complexity, films formed by plasma processing are used frequently in the fabrication process, e.g., deposition and etching of oxides or nitrides for interconnect dielectric layers. Many of these processes, which are conducted in a reaction chamber, suffer from a film buildup on the inner surfaces of the reaction chamber as well as exposed surfaces of equipment parts (e.g., gas injectors, stages, thickness monitors, windows, heaters, wires, etc.). Film buildups within the reaction chamber can break loose during processes causing unacceptably high levels of particulate contamination on substrate surfaces. In some cases, the film buildups over time can also affect the semiconductor processing conditions, such as gas pressure and flow rate. To overcome these problems, frequent and routine cleaning of semiconductor processing reaction chambers is necessary in order to achieve and maintain high production yields.

Undesired film buildups can be removed from the inner surfaces of the reaction chamber by a wet cleaning process known as an ex-situ cleaning process. This method for removing contaminants from reactors such as a tube furnace is time-consuming, which involves physically disassembling the tube furnace and removing wafer boats, allowing the tube and wafer boats to cool, soaking them in a wet chemical bath, rinsing them with DI water, drying them, reinstallation, thermal stabilization, checking leaks, and process requalification to ensure that tube cleaning has not altered film deposition conditions. The whole process can take several hours during which the system is inoperable for wafer production. Further, ex-situ cleaning increases the risk of breaking tubes, cross-contamination and disposal of a large volume of acid cleaning solution.

On the other hand, the film buildups can be also removed from the inner surfaces of reaction chambers by a dry cleaning method using plasma-assisted etching, which is an in-situ cleaning process based on either an in-situ plasma source in the same reaction chamber or a remote plasma source separated from the reaction chamber. Such in-situ plasma cleaning removes the film buildups using a gas-phase chemical reaction by converting the film buildups into a volatile species that can be vacuum pumped out from the reaction chamber. In contrast to wet-cleaning, this method removes deposits rather quickly by using a reactive plasma, minimizing the tool downtime. However, this method still suffers from lack of efficiency when cleaning film buildups formed in narrow spaces such as, for example, inner surfaces of gas injector tubes. Furthermore, due to repeated cleaning processes, the size of the opening in the gas injector nozzle can be changed due to excessive over-etching, which results in variations in injecting pressure. This change of pressure may affect the atmosphere of the chamber and processing (etching or deposition) characteristics can be adversely influenced. Consequently, frequent replacement of gas injector nozzle heads may be necessary, which increases the cost of maintenance affecting the economics of the process. Therefore, there exists a need for a new gas injector design and a method for effectively cleaning gas injector nozzle heads to minimize film buildup formation, to minimize potential contamination and to improve the production yield. Also, there is a need to further minimize damage to the nozzle heads so that injection pressure and thus the processing characteristics are not adversely affected.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

Figure 1:
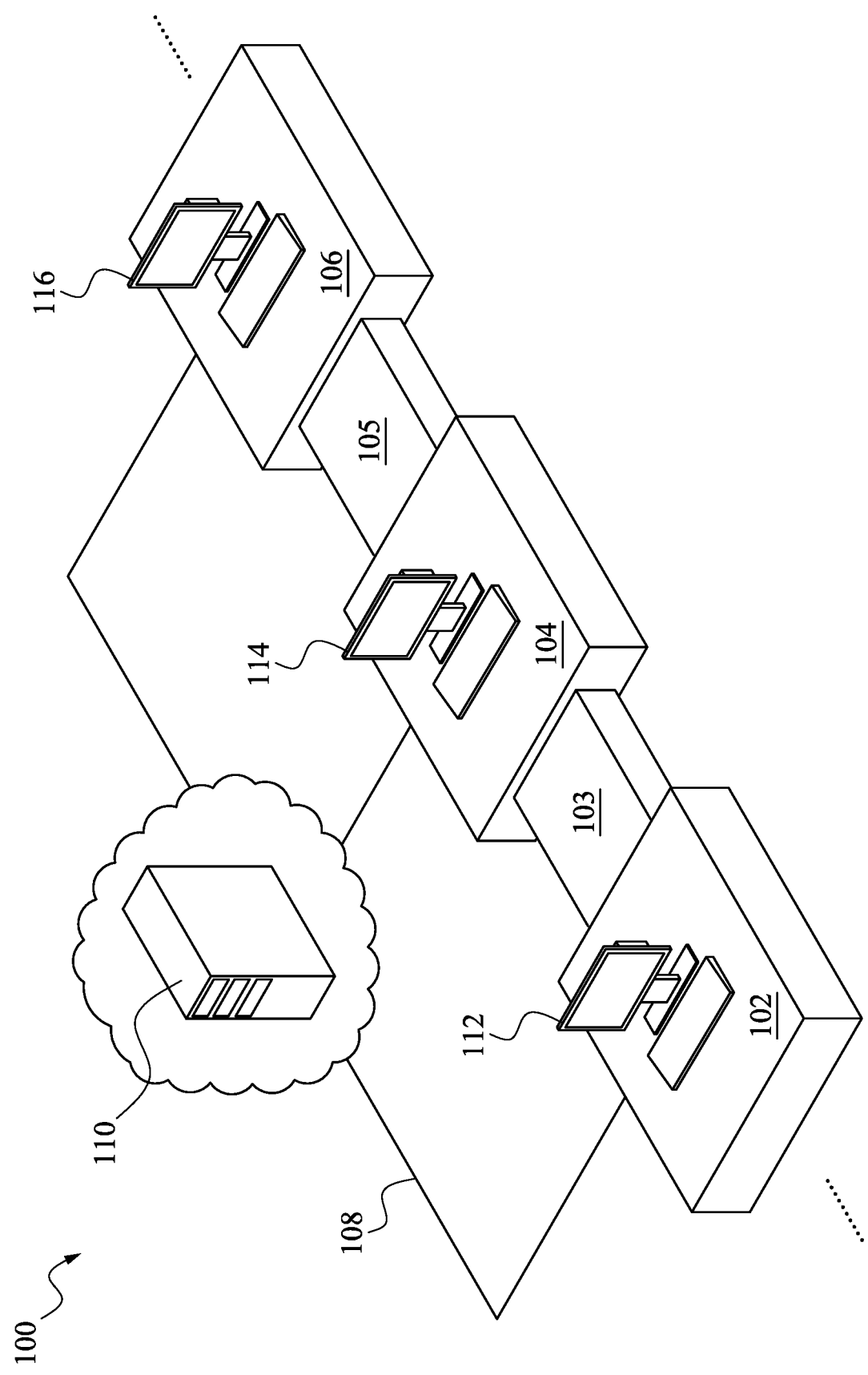
FIG. 1 illustrates a block diagram of a semiconductor manufacturing production system integrating a plasma processing station, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The presented disclosure provides various embodiments of novel gas injectors in a semiconductor processing reaction chamber, e.g., plasma dry etching, plasma enhanced chemical vapor deposition, plasma-enhanced atomic layer deposition systems, etc. Traditionally, the end of a gas injector in a processing reaction chamber has a tube shape allowing the formation of film buildups, either from a deposition or a cleaning process, to easily penetrate deep into the gas injector, which becomes difficult to get cleaned during an in-situ plasma dry cleaning process. In this presented disclosure, by employing a variety of adaptor designs to a traditional gas injector in a semiconductor processing reaction chamber, one can minimize film buildups formation, so as to maximize the efficiency of dry cleaning (e.g., shorter cleaning time and thus shorter equipment downtime), to minimize potential particulate contamination, and to improve the device production yield. These adaptors also minimize the damage to the head of the gas injector so as to minimize the change to the processing characteristics. Finally, the adaptors can be easily integrated inside and/or outside of the end of the current gas injector designs in a reaction chamber to minimize the cost of modification to the existing systems. Accordingly, the above-mentioned issues may be advantageously avoided.

This description of the exemplary embodiments is set to be understood in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

FIG. 1 illustrates a block diagram of a semiconductor manufacturing production system 100 integrating a plasma processing station 106 with a novel gas injector design, in accordance with some embodiments of the present disclosure. It is noted that the system 100 is merely an example, and is not intended to limit the present disclosure. Accordingly, it is understood that additional operations may be provided before, during, and after the system 100 of FIG. 1, and that some other operations may only be briefly described herein.

The system 100 comprises a plurality of processing stations 102 and 106, and an in-line inspection station 104 located between the processing stations 102 and 106. Examples of IC manufacturing processes conducted in the processing stations 102 and 106 include cleaning, photolithography, wet etching, dry etching, dielectric deposition, metal deposition, and any semiconductor processes known in the art. In some embodiments, the processing station 102 is a photolithography station and the processing station 106 is a plasma processing station (e.g., plasma-enhanced deposition or etching station). At least one feature can be created in each processing station 102/106 including a photoresist pattern, a metal contact, an etch trench, an isolation, a via structure/hole, an interconnect line, and the like.

At least one in-line inspection station 104 is coupled between the processing stations 102 and 106, in which at least one wafer from the processing station 102 can be inspected for its critical dimensions before being transferred to the plasma processing station 106. At least one storage station (not shown) can be coupled to the in-line inspection station 104, in which a wafer with out of range critical dimensions, distributions, or defects as determined by the in-line inspection station 104 can be extracted from the production line and stored in the storage station for reprocessing or rejection, instead of being transferred to the plasma processing station 106.

In some embodiments, the inspection station 104 can be a post-development inspection system that provides a measurement of critical dimensions of patterns in a photoresist layer on a wafer after being exposure and developed. In some embodiments, the wafer can be a silicon (Si) wafer with conductive features or a wafer with dielectric layers and interconnects/via structures after the front-end-of-line (FEOL) processes. Typically, the dimension of the photoresist pattern on the wafer surface can be measured by a critical dimension-scanning electron microscope (CD-SEM). The CD-SEM has been widely used to detect small physical defects that are difficult to detect by traditional microscopic optical inspection systems due to their lack of sensitivity and resolution. Besides CD-SEM systems, other types of advanced automated processing control technologies for CD inspection can be used, such as optical critical dimension (OCD) measurement systems using scatterometry with multi-Azimuth angles and multi-channel optics, Normal-Incidence Spectroscopic Polarized Reflectance, and Ellipsometry, in accordance with various embodiments.

Referring still to FIG. 1, the microscopic images and/or the plurality of CD values from the in-line inspection station 104 can be stored and preprocessed by a local computer 114. Examples of preprocessing can include reconstruction of the plurality of values and the plurality of test positions into a two-dimensional (2D) map, as described in further detail below. In some embodiments, an image processing operation can be performed by the local computer 114 as part of the preprocessing to automatically compare design criteria with the microscopic images of the wafer surface according to pre-defined threshold values or criterion, e.g., line width, irregular shape, non-uniformity, and the like.

In some embodiments, a wafer that fails to meet a pre-defined threshold value or criterion (e.g., determined to be defective or non-uniformity cannot be fixed by tuning temperature only in a later process), and thus determined to be not qualified for continued processing. Such a wafer is transferred by a conveyor from the in-line inspection station 104 to a cassette in a storage station (not shown) for reprocessing or rejection, in accordance with various embodiments. On the other hand, if the wafer is determined to satisfy the pre-defined threshold value or criterion, then it is transferred by the conveyor to the plasma processing station 106 through the exchange chamber 105 for further processing. In some embodiments, the threshold value may vary depending on the application and can be set by manufacturers. In some embodiments, the processing stations (102 and 106) and in-line inspection station (104) may not located in a same processing bay area and can be coupled by an automatic material handling system (AMHS), wherein wafers/cassettes are moved by an AMHS vehicle on overhead rails or on the ground between stations.

The local computers 112, 114 and 116 are each coupled to a remote computer resource 110 through a connection 108. In some embodiments, the connection 108 may include an Ethernet cable, an optical fiber, a wireless communication media, and/or other networks known in the art. It should be understood that other connections and intermediate circuits can be deployed between the local computers 112, 116 and 114 associated with the processing stations 102, 106 and the in-line inspection station 104, and the remote computer resource 110 to facilitate interconnection.

Referring still to FIG. 1, the local computer 116 configures the plasma processing conditions (e.g., pressure, gas, temperature, power, etc.) on the plasma processing station 106 for the plasma processing on wafers received from the in-line inspection station 104, in accordance with some embodiments. As discussed further in detail below, in some embodiments, the local computer 116 provides control signals to a temperature control unit, a pressure control unit, a plasma control unit and a gas control unit within the plasma processing station 106. The control signal from the local computer 116 is generated according to a pre-defined recipe for semiconductor processing, in some embodiments. The control signal can be also generated according to the analysis results from the remote computer resource 110 based on the in-line inspection results. In some embodiments, the local computer 116 is also configured to provide control to aforementioned control units to create conditions for plasma dry cleaning of the reaction chamber.

Although the system 100 in the illustrated embodiment of FIG. 1 includes only two processing stations 102/106, one in-line inspection station 104, two exchange chambers 103/105, three local computers 112/114/116, and one remote computer resource 110, it is understood that the embodiment of FIG. 1 is merely provided for illustration purposes. The system 100 may include any desired number of processing stations with any desired number of in-line inspection stations, and storage stations while remaining within the scope of the present disclosure. Furthermore, in some embodiments, an in-line inspection station 104 can be coupled to two or more processing stations 102/106 and/or two or more storage stations. In some embodiments, two or more in-line inspection stations 104 can be located between two processing stations providing complementary inspections using different techniques (e.g., electrical and/or optical measurement).

Figure 2A:
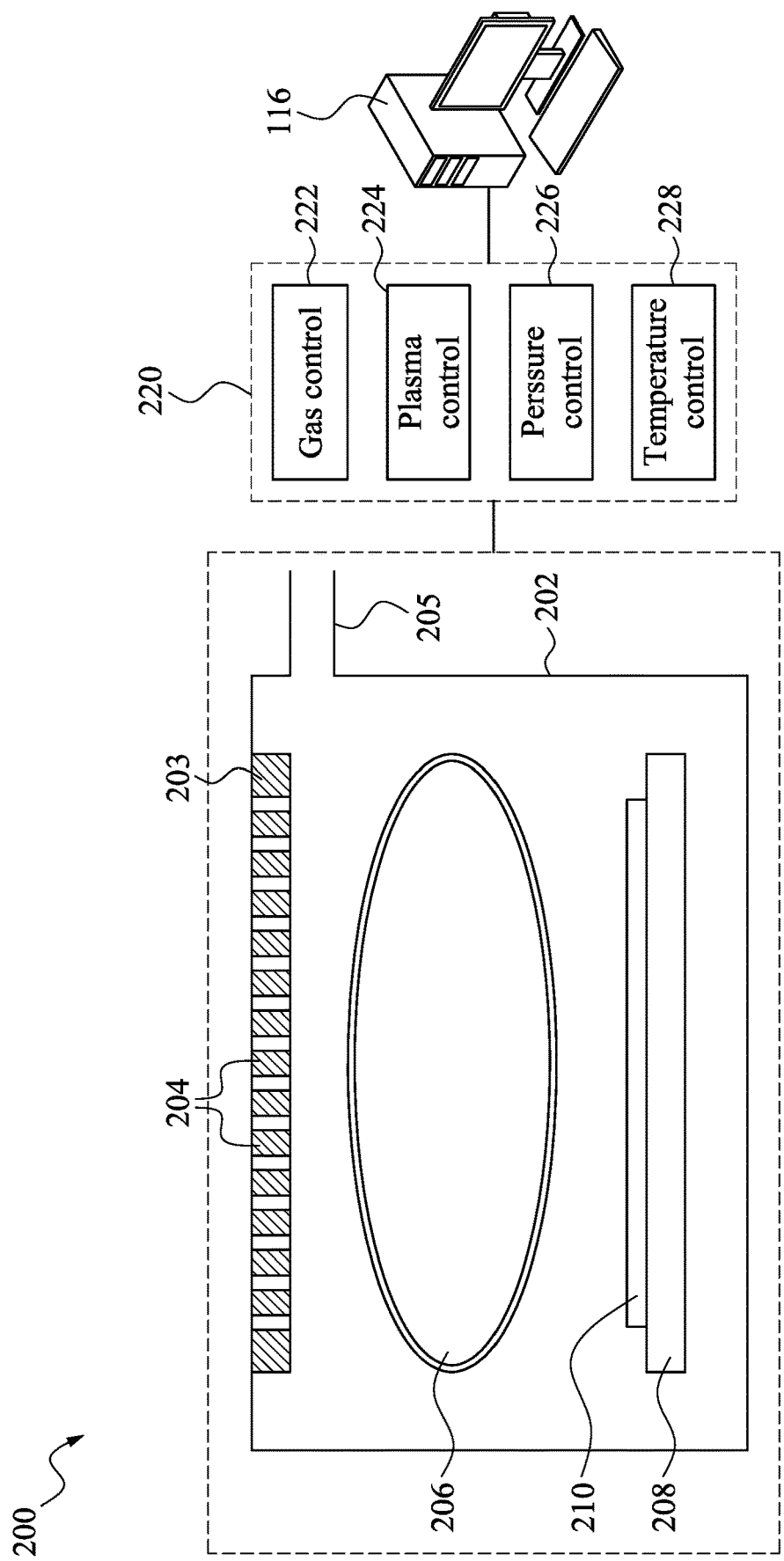
FIG. 2A illustrates a plasma processing system for plasma processing with a gas injector, in accordance with some embodiments of the present disclosure.

FIG. 2A illustrates a plasma processing system 200 for plasma processing with a gas injector 204, in accordance with some embodiments of the present disclosure. The processing chamber 202 comprises at least one plasma cathode 203, a plurality of gas injectors 204, and at least one vacuum port 205 connected to a pressure control unit (e.g., vacuum pump). In some embodiments, the plurality of gas injectors 204 can be located in close proximity to the at least one plasma cathode 203 (e.g., behind the cathode). The at least one plasma cathode 203 is coupled to a radio frequency (RF) power source and a respective matching circuit (not shown) operating at frequencies from a few tens of kilohertz (KHz) to tens of megahertz (MHz) at a pressure of a few millitorr (mTorr) to a few Torr. By applying an AC voltage between the at least one plasma cathode 203 and the wafer stage 208, a plasma 206 (i.e., a gas that contains ionized atoms or molecules) can be formed on the plasma cathode 203 and may extend across the space between the plasma cathode 203 and the wafer stage 208 to the surface of a semiconductor wafer 210, in accordance with certain embodiments. In some embodiments, for a plasma deposition processing station, the at least one plasma cathode 203 can be directly connected to a DC discharge power source to form the plasma 206 at a pressure of a few mTorr to a few Torr. In some embodiments, technologies, such as for instance inductively coupled plasma (ICP), electron cyclotron resonance (ECR), microwave, and helicon wave, can be integrated with the RF power source for creation of high-density discharges with desired deposition and/or etching properties.

The plasma processing system 200 can be a plasma etching processing station or a plasma-enhanced deposition processing station (e.g., plasma enhanced chemical vapor deposition (PECVD), plasma enhanced atomic layer deposition (PEALD), etc.), in accordance with various embodiments. According to the exemplary embodiment described herein, the plasma processing system 200 can be used in processing the surface layers of a semiconductor wafer 210. For example, any of a photoresist layer, mask layer, or other layers of a semiconductor wafer as desired, can be processed before or after a plasma processing step, or any combination thereof, according to a specified recipe. The recipe also specifies conditions used to establish the proper environment in the plasma processing chamber 202 for realizing the desired features and feature dimensions on the semiconductor wafer 210. In some embodiments, the recipe can also specify the plasma processing conditions including a type of reactant gas to be introduced into the plasma processing chamber and its flow rate, a pressure during reaction, a power and frequency of the RF signal provided to the plasma cathode 203 or the wafer stage 208. In one embodiment, the reaction chamber 202 may be made of stainless steel, quartz, SiC or any other suitable material commonly used in the art. Other conventional appurtenances typically used in conjunction with reaction chamber 202 processing assemblies may be provided.

The back of the wafer stage 208 can be coupled to electrical ground, according to some embodiments. In certain embodiments, the wafer stage 208 can be also coupled to an RF power source. Although not shown in the figure, for the ones with ordinary skill in the art it is understandable that the plasma processing chamber 202 may be also equipped with a plurality of pressure gauges, thickness monitor systems (quartz crystal monitor, spectroscopic ellipsometer, reflection high-energy electron diffraction detector (RHEED)), shutters, a rotational manipulator, viewports, transfer ports, etc.

In some embodiments, the gas through the plurality of gas injectors 204 to the plasma processing chamber 202 may include at least one or a combination of $O_2$, Ar, $N_2$, $H_2$, $NH_3$, $N_2O$, $CF_4$, $SF_6$, $CCl_4$, $CH_4$, $H_2S$, $SiH_4$, metal-containing precursors, etc. for plasma processing.

The wafer 210 may be a bulk silicon substrate although other semiconductor materials including elements in group II, group III, group IV, or group V may also be used. Alternatively, the substrate may be a silicon-on-insulator (SOI) substrate. In some embodiments, a device layer may be a polysilicon layer disposed on a substrate (not shown) for the formation of one or more polysilicon gates on the wafer 210. In another embodiment, the device layer may be a metallization layer such as an inter-layer dielectric (ILD) or an inter-metal dielectric layer (IMD) for forming interconnect structures (e.g., metal lines and/or vias). In yet other embodiments, the device layer may be any layer in the wafer 210 that may be patterned using photolithography and etching processes. The wafer 210 may include numerous device layers. Furthermore, the device layer may include a buffer layer (e.g., an oxide interfacial layer, not shown), an etch stop layer (e.g., a silicon nitride layer, a silicon carbide layer, or the like), or the like. A hard mask may be formed over the device layer for use as a patterning mask. The hard mask may comprise an oxide, silicon oxynitride (SiON), silicon nitride ($Si_3N_4$), titanium nitride (TiN), or the like.

Referring still to FIG. 2A, in some embodiments, the wafer stage 208 in the semiconductor processing system 200 is an electrostatic chuck, which can eliminate edge effects due to gripper fingers or rings. The electrostatic chuck can also reduce the particle generation due to the elimination of front side contact and fewer moving parts. Meanwhile the electrostatic chuck can also provide uniform RF and thermal contact to the substrates. In some embodiments, the wafer stage 208 in the plasma processing system 200 can be equipped with at least one temperature control element and at least one temperature sensing element for temperature control.

In some embodiments, the plasma processing system 200 further comprises a control unit 220, which comprises a number of control units, including a gas control unit 222, a plasma control unit 224, a pressure control unit 226 and a temperature control unit 228. In some embodiments, the gas control unit 222 comprises a plurality of reaction gas tanks containing carrier gases (e.g., Ar, N2, H2, and etc.) and reaction gases (e.g., SiH4, C4F8, CF4, C3F8, CHF3, C2F6, C3F6, NH3, H2, F2, Cl2, SiCl4, BCl3, HBr, SF6, BrF3, ClF3, XeF2, CH4, etc.) depending on the type of reactions (e.g., deposition or etching) and type of materials, and a plurality of gas supply lines. In some embodiments, molecular O2 may be added to remove undesired fluorocarbon polymer residuals on surfaces. Molecular $N_2$ may be added especially when etching silicon nitride, in accordance with some embodiments. In some embodiments, H2 gas input can be eliminated when tube deposits comprise primarily poly-Si or Si oxide. In some other embodiments, H2 cleaning gas input can be used for cleaning certain types of compounds, e.g., metal silicides. In some embodiments, cleaning gases including can be used for cleaning polymeric compound formed during plasma etching process. For example, chlorine- or bromine-containing compounds can be used to remove polymeric residues formed during III-V etching (e.g., InP, GaAs, GaP, etc.). For another example, NF3 and SF6 can be used to remove carbonfluoride polymeric residues formed during a Si or SiO2 etching. The plurality of gas supply lines each comprises a mass flow controller (MFC), an input valve, and an output valve are integrated and can be controlled separately by a control computer 116.

In some embodiments, the plasma control unit 224 may comprise at least one plasma power supply to the at least one plasma cathode 203 and the wafer stage 208. In some embodiments, the plasma control unit 224 may comprise a remote plasma source (not shown) for cleaning the plasma reaction chamber. The active species resulted from the remote plasma system is transferred by a carrier gas to the reaction chamber 202 via the gas control unit 222. Materials between the plasma source and the reaction chamber must be resistant to attack by the plasma and distance between the remote plasma source and the reaction chamber 202 should be kept as short as possible. Generating the cleaning plasma in a remote plasma source allows the use of an efficient plasma generator and does not subject tubes to the temperature, radiation, or bombardment of the glow discharge that may be present in a plasma formed in-situ.

The control computer 116 provides control to the gas control unit 222, the plasma control unit 224, the pressure control unit 226, and the temperature control unit 228. The control computer 116 can also receive input from a gas analyzer (not shown) which is connected to the exhaust line 205 of the reaction chamber 202, by detecting the chemical composition of the exhaust gases. With continuous reference to FIG. 1, the control unit 220 comprises a processor, a memory, an input/output interface, a communications interface, and a system bus.

The processor may comprise any processing circuitry operative to control the operations and performance of the control of gas, temperature, plasma and pressure. In various aspects, the processor may be implemented as a general purpose processor, a chip multiprocessor (CMP), a dedicated processor, an embedded processor, a digital signal processor (DSP), a network processor, an input/output (I/O) processor, a media access control (MAC) processor, a radio baseband processor, a co-processor, a microprocessor such as a complex instruction set computer (CISC) microprocessor, a reduced instruction set computing (RISC) microprocessor, and/or a very long instruction word (VLIW) microprocessor, or other processing device. The processor also may be implemented by a controller, a microcontroller, an application specific integrated circuit (ASIC), a field programmable gate array (FPGA), a programmable logic device (PLD), and so forth.

In various aspects, the processor may be arranged to run an operating system (OS) and various applications. Examples of an OS comprise, for example, operating systems generally known under the trade name of Apple OS, Microsoft Windows OS, Android OS, and any other proprietary or open source OS. Examples of applications comprise, for example, a telephone application, a camera (e.g., digital camera, video camera) application, a browser application, a multimedia player application, a gaming application, a messaging application (e.g., email, short message, multimedia), a viewer application, and so forth.

In some embodiments, at least one non-transitory computer-readable storage medium is provided having computer-executable instructions embodied thereon, wherein, when executed by at least one processor, the computer-executable instructions cause the at least one processor to perform embodiments of the methods described herein. This computer-readable storage medium can be embodied in the memory.

In some embodiments, the memory may comprise any machine-readable or computer-readable media capable of storing data, including both volatile/non-volatile memory and removable/non-removable memory. The memory may comprise at least one non-volatile memory unit. The non-volatile memory unit is capable of storing one or more software programs. The software programs may contain, for example, applications, user data, device data, and/or configuration data, or combinations therefore, to name only a few. The software programs may contain instructions executable by the various components of the control circuit 314 of the system 300.

For example, memory may comprise read-only memory (ROM), random-access memory (RAM), dynamic RAM (DRAM), Double-Data-Rate DRAM (DDR-RAM), synchronous DRAM (SDRAM), static RAM (SRAM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk memory (e.g., floppy disk, hard drive, optical disk, magnetic disk), or card (e.g., magnetic card, optical card), or any other type of media suitable for storing information.

In one embodiment, the memory may contain an instruction set, in the form of a file for executing a method of generating one or more timing libraries as described herein. The instruction set may be stored in any acceptable form of machine-readable instructions, including source code or various appropriate programming languages. Some examples of programming languages that may be used to store the instruction set comprise, but are not limited to: Java, C, C++, C#, Python, Objective-C, Visual Basic, or .NET programming. In some embodiments a compiler or interpreter is comprised to convert the instruction set into machine executable code for execution by the processor.

In some embodiments, the I/O interface may comprise any suitable mechanism or component to at least enable a user to provide input to the control circuit 314 of the system 300 and the control circuit 314 to provide output to the user. For example, the I/O interface may comprise any suitable input mechanism, including but not limited to, a button, keypad, keyboard, click wheel, touch screen, or motion sensor. In some embodiments, the I/O interface may comprise a capacitive sensing mechanism, or a multi-touch capacitive sensing mechanism (e.g., a touchscreen).

In some embodiments, the I/O interface may comprise a visual peripheral output device for providing a display visible to the user. For example, the visual peripheral output device may comprise a screen such as, for example, a Liquid Crystal Display (LCD) screen, incorporated into the control circuit 314 of the system 300. As another example, the visual peripheral output device may comprise a movable display or projecting system for providing a display of content on a surface remote from the control circuit 314 of the system 300. In some embodiments, the visual peripheral output device can comprise a coder/decoder, also known as a Codec, to convert digital media data into analog signals. For example, the visual peripheral output device may comprise video Codecs, audio Codecs, or any other suitable type of Codec.

The visual peripheral output device also may comprise display drivers, circuitry for driving display drivers, or both. The visual peripheral output device may be operative to display content under the direction of the processor. For example, the visual peripheral output device may be able to play media playback information, application screens for applications implemented on the control circuit 314 of the system 300, information regarding ongoing communications operations, information regarding incoming communications requests, or device operation screens, to name only a few.

In some embodiments, the communications interface may comprise any suitable hardware, software, or combination of hardware and software that is capable of coupling the control circuit 314 of the system 300 to one or more networks and/or additional devices. The communications interface may be arranged to operate with any suitable technique for controlling information signals using a desired set of communications protocols, services or operating procedures. The communications interface may comprise the appropriate physical connectors to connect with a corresponding communications medium, whether wired or wireless.

Systems and methods of communication comprise a network, in accordance with some embodiments. In various aspects, the network may comprise local area networks (LAN) as well as wide area networks (WAN) including without limitation Internet, wired channels, wireless channels, communication devices including telephones, computers, wire, radio, optical or other electromagnetic channels, and combinations thereof, including other devices and/or components capable of/associated with communicating data. For example, the communication environments comprise in-body communications, various devices, and various modes of communications such as wireless communications, wired communications, and combinations of the same.

Wireless communication modes comprise any mode of communication between points (e.g., nodes) that utilize, at least in part, wireless technology including various protocols and combinations of protocols associated with wireless transmission, data, and devices. The points comprise, for example, wireless devices such as wireless headsets, audio and multimedia devices and equipment, such as audio players and multimedia players, telephones, including mobile telephones and cordless telephones, and computers and computer-related devices and components, such as printers, network-connected machinery such as a circuit generating system 404, and/or any other suitable device or third-party device.

Wired communication modes comprise any mode of communication between points that utilize wired technology including various protocols and combinations of protocols associated with wired transmission, data, and devices. The points comprise, for example, devices such as audio and multimedia devices and equipment, such as audio players and multimedia players, telephones, including mobile telephones and cordless telephones, and computers and computer-related devices and components, such as printers, network-connected machinery, and/or any other suitable device or third-party device. In various implementations, the wired communication modules may communicate in accordance with a number of wired protocols. Examples of wired protocols may comprise Universal Serial Bus (USB) communication, RS-232, RS-422, RS-423, RS-485 serial protocols, FireWire, Ethernet, Fiber Channel, MIDI, ATA, Serial ATA, PCI Express, T-1 (and variants), Industry Standard Architecture (ISA) parallel communication, Small Computer System Interface (SCSI) communication, or Peripheral Component Interconnect (PCI) communication, to name only a few examples.

Accordingly, in various aspects, the communications interface may comprise one or more interfaces such as, for example, a wireless communications interface, a wired communications interface, a network interface, a transmit interface, a receive interface, a media interface, a system interface, a component interface, a switching interface, a chip interface, a controller, and so forth. When implemented by a wireless device or within wireless system, for example, the communications interface may comprise a wireless interface comprising one or more antennas, transmitters, receivers, transceivers, amplifiers, filters, control logic, and so forth.

In various embodiments, the communications interface may provide voice and/or data communications functionality in accordance a number of wireless protocols. Examples of wireless protocols may comprise various wireless local area network (WLAN) protocols, including the Institute of Electrical and Electronics Engineers (IEEE) 802.xx series of protocols, such as IEEE 802.11a/b/g/n, IEEE 802.16, IEEE 802.20, and so forth. Other examples of wireless protocols may comprise various wireless wide area network (WWAN) protocols, such as GSM cellular radiotelephone system protocols with GPRS, CDMA cellular radiotelephone communication systems with 1×RTT, EDGE systems, EV-DO systems, EV-DV systems, HSDPA systems, and so forth. Further examples of wireless protocols may comprise wireless personal area network (PAN) protocols, such as an Infrared protocol, a protocol from the Bluetooth Special Interest Group (SIG) series of protocols, including Bluetooth Specification versions v1.0, v1.1, v1.2, v2.0, v2.0 with Enhanced Data Rate (EDR), as well as one or more Bluetooth Profiles, and so forth. Yet another example of wireless protocols may comprise near-field communication techniques and protocols, such as electromagnetic induction (EMI) techniques. An example of EMI techniques may comprise passive or active radio-frequency identification (RFID) protocols and devices. Other suitable protocols may comprise Ultra Wide Band (UWB), Digital Office (DO), Digital Home, Trusted Platform Module (TPM), ZigBee, and so forth.

In some embodiments, the control circuit 314 of the system 300 may comprise a system bus that couples various system components including the processor, the memory, and the I/O interface. The system bus can be any of several types of bus structure(s) including a memory bus or memory controller, a peripheral bus or external bus, and/or a local bus using any variety of available bus architectures including, but not limited to, 9-bit bus, Industrial Standard Architecture (ISA), Micro-Channel Architecture (MCA), Extended ISA (EISA), Intelligent Drive Electronics (IDE), VESA Local Bus (VLB), Personal Computer Memory Card International Association (PCMCIA) Bus, Small Computer System Interface (SCSI) or other proprietary bus, or any custom bus suitable for computing device applications.

Figure 2B:
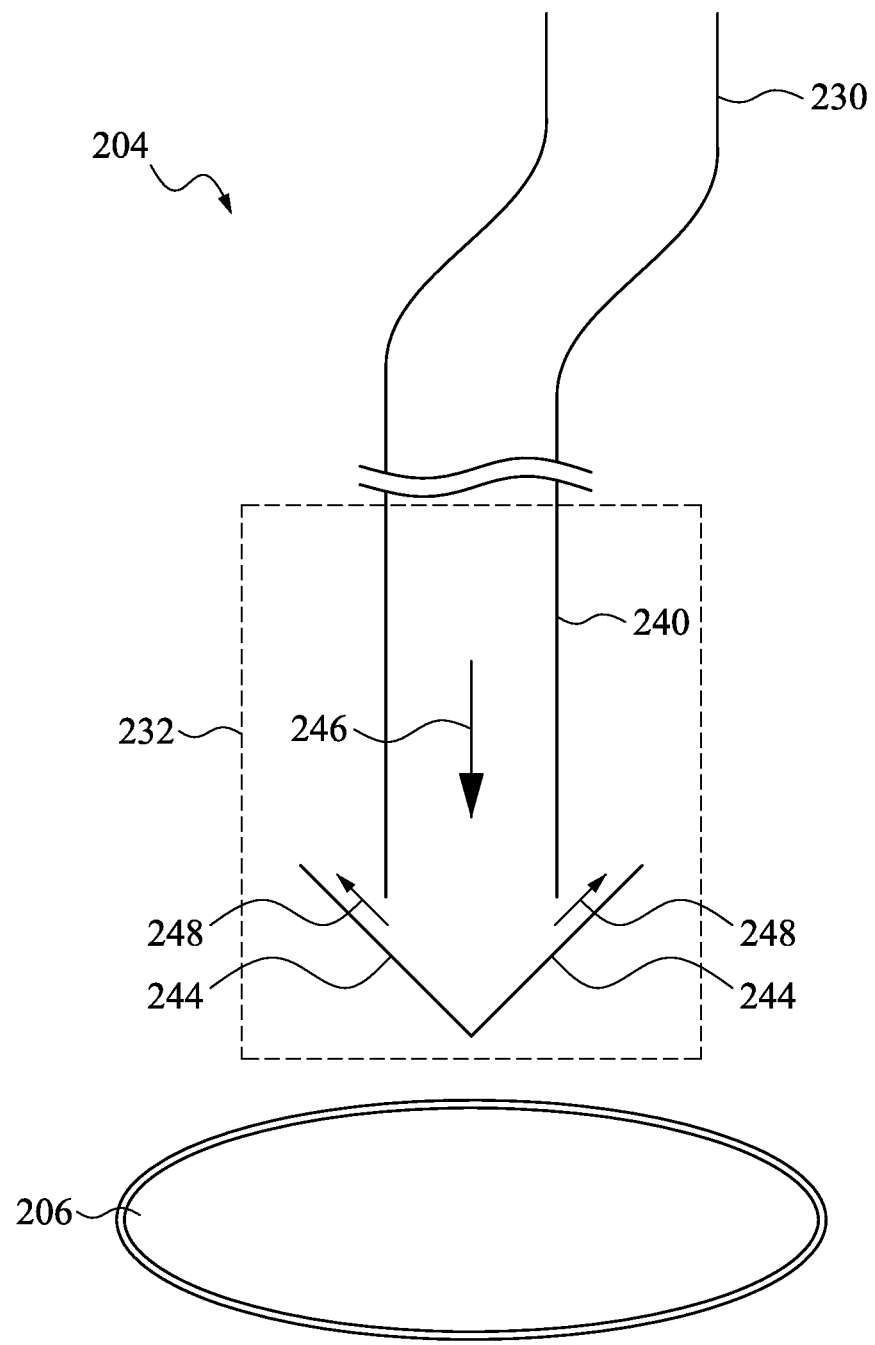
FIG. 2B illustrates a cross-sectional view of a nozzle head of a gas injector with an adaptor outside a body, in accordance with some embodiments of the present disclosure.

FIG. 2B illustrates a cross-sectional view of a gas injector with an adaptor 242 outside the body 240, in accordance with some embodiments of the present disclosure. The plurality of gas injectors 204 in the plasma processing system 200 each comprises a tube 230 and a nozzle head 232, wherein the nozzle head 232 comprises a body 240 and an adaptor 242. In some embodiments, the body 204 can be made of quartz. The tube 230 can be connected to the gas control unit 222 receiving at least one reactive gas and delivering the at least one reactive gas to the reaction chamber 202, in some embodiments. The adaptor 242 can be placed inside or outside the body 240 to redirect the supply gas flow 246 so as to create second gas flow 248 which deviates from the originally gas flow 246, in accordance with some embodiments. The supply gases exit the gas injector 204 into the reaction chamber 202 to create a plasma 206 in the space between the plasma cathode 203 and wafer stage 208. The adaptor 242 has at least two surfaces, a first surface and a second surface, wherein the first surface faces the original gas flow 246 and the second surface is on the opposite side of the first surface of the component. In some embodiments, the second surface of the adaptor 242 faces the plasma 206 created during the plasma dry-cleaning process or the stage 208. In some embodiments, the plasma 206 created during the plasma dry-cleaning process can react with a layer of film buildup 244 on the second surface of the adaptor 242 for in-situ dry cleaning purposes.

In some embodiments, the adaptors 242 comprises one of the following: quartz, ceramics, graphite, metal, semiconductors (e.g., Si) and polymers. In some embodiments, the adaptors 242 can be made of plasma-resistant polymers such as for example perfluoro-elastomers (FFKM) and tetrafluoro ethylene/propylene rubbers (FEPM). In some embodiments, the plasma dry cleaning process has high selectivity in etching film buildup over the adaptors 242. In some embodiments, the adaptors 242 can be made of thermoplastic polymers that can be injection molded or 3D printed to achieve complicated structures, as described in detail later. In some embodiments, the plasma-resistant thermoplastic polymers are also chemically stable that do not react with the supply gases. In some embodiments, the adaptor 242 can be mechanically machined. In some embodiments, the adaptor 242 can be easily replaced or attached to the nozzle head 232.

Figure 2C:
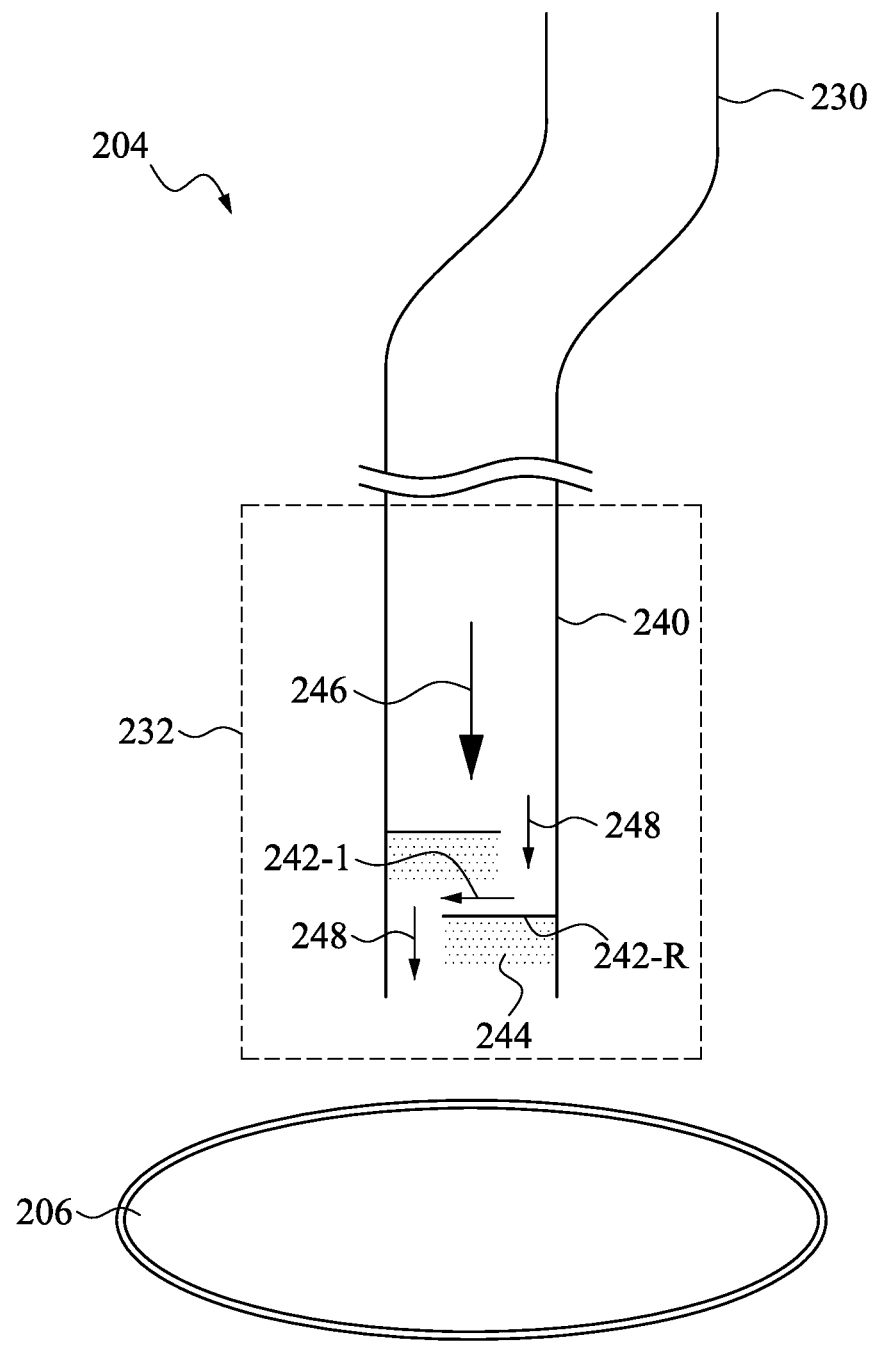
FIG. 2C illustrates a cross-sectional view of a nozzle head of a gas injector with an adaptor inside the body, in accordance with some embodiments of the present disclosure.

FIG. 2C illustrates a cross-sectional view of a gas injector 204 with an adaptor 242 inside the body 240, in accordance with some embodiments of the present disclosure. The adaptor 242 comprises two flow regulation components (hereinafter "components"), i.e., 242-L and 242-R, which are placed in series along the wall of the inner surface of the body 240 so as to regulate the original gas flow 246 in the body 240. In some embodiments, the body 240 comprises quartz. The two components are identical and one is rotated 180 degrees relative to the other, in accordance with some embodiments. Specifically, the configuration of the two components of the adaptor 242 changes the direction of the main gas flow 246 to the regulated gas flow 248, in some embodiments. The regulated gas flow 248 may flow in parallel along the gap between the two components 242-L and 242-R and then exists to the free space in the reactive chamber 202, according to some embodiments. The regulated gas flow 248 carries reactive gases that are then used for plasma processing on semiconductor substrates and/or for plasma dry cleaning of the reactive chamber. Due to the configuration of the two components on the opposite sidewall of the body 240, the film buildup 244 formed during the plasma processing will be confined on the bottom surface of two components of the adaptor 242 which are facing the free space between the plasma cathode 203 and the wafer stage 208. Similarly, due to the configuration of the two components on the opposite sidewall of the body 240, the film buildup 244 can be removed by the dry-cleaning plasma effectively so that the contamination from unsatisfactory removal of film buildup on the inner surface of the body 240 of the gas injector 204 during a later plasma processing on the semiconductor substrates can be minimized.

Figure 2D:
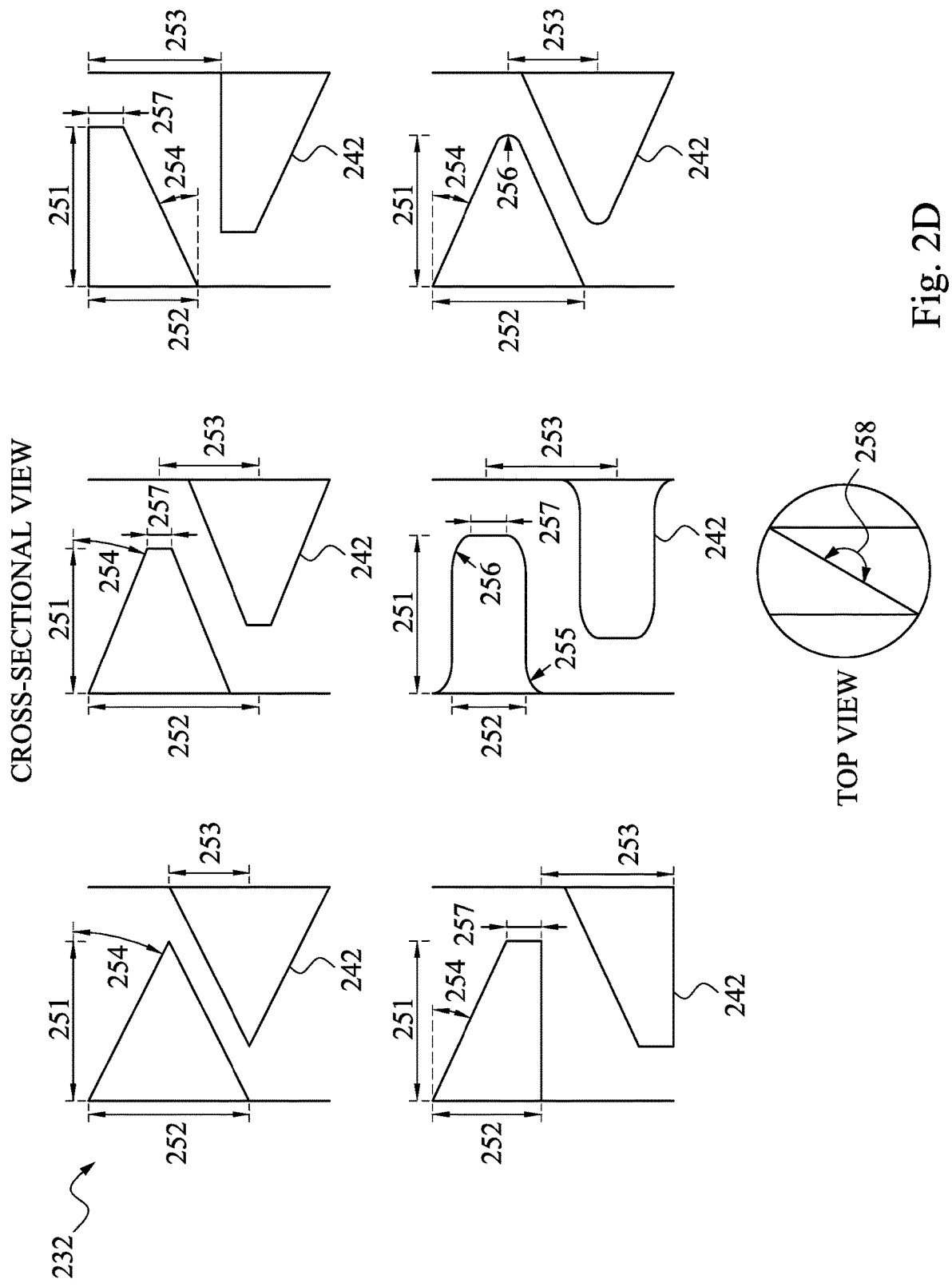
FIG. 2D illustrates cross-sectional views and a top view of adaptors with two components under various geometric configurations, in accordance with some embodiments of the present disclosure.

FIG. 2D illustrates cross-sectional views and a top view of nozzle head 232 of a gas injector 204 with an adaptor 242 under various geometric configurations, in accordance with some embodiments of the present disclosure. In some embodiments, the plurality of adaptors 242 each comprises two components. The two components comprise different geometric configurations, including a height 251, a bottom width 252, a pitch size 253, a sidewall angle 254, a bottom curvature 255, a top curvature 256, a tip width 257, and a component rotation angle 258. Although the two components of the adaptor 242 in the illustrated embodiment of FIG. 2D includes only six different geometric configurations, it is understood that the embodiment of FIG. 2D is merely provided for illustration purposes. The two components of the adaptor 242 may include any desired geometric configurations (including height, bottom width, pitch size, sidewall angle, bottom curvature, top curvature, and top width) to effectively regulate the original gas flow and to block the film buildup formation in the body 240 of the gas injector 204 while remaining within the scope of the present disclosure.

Figure 2E:
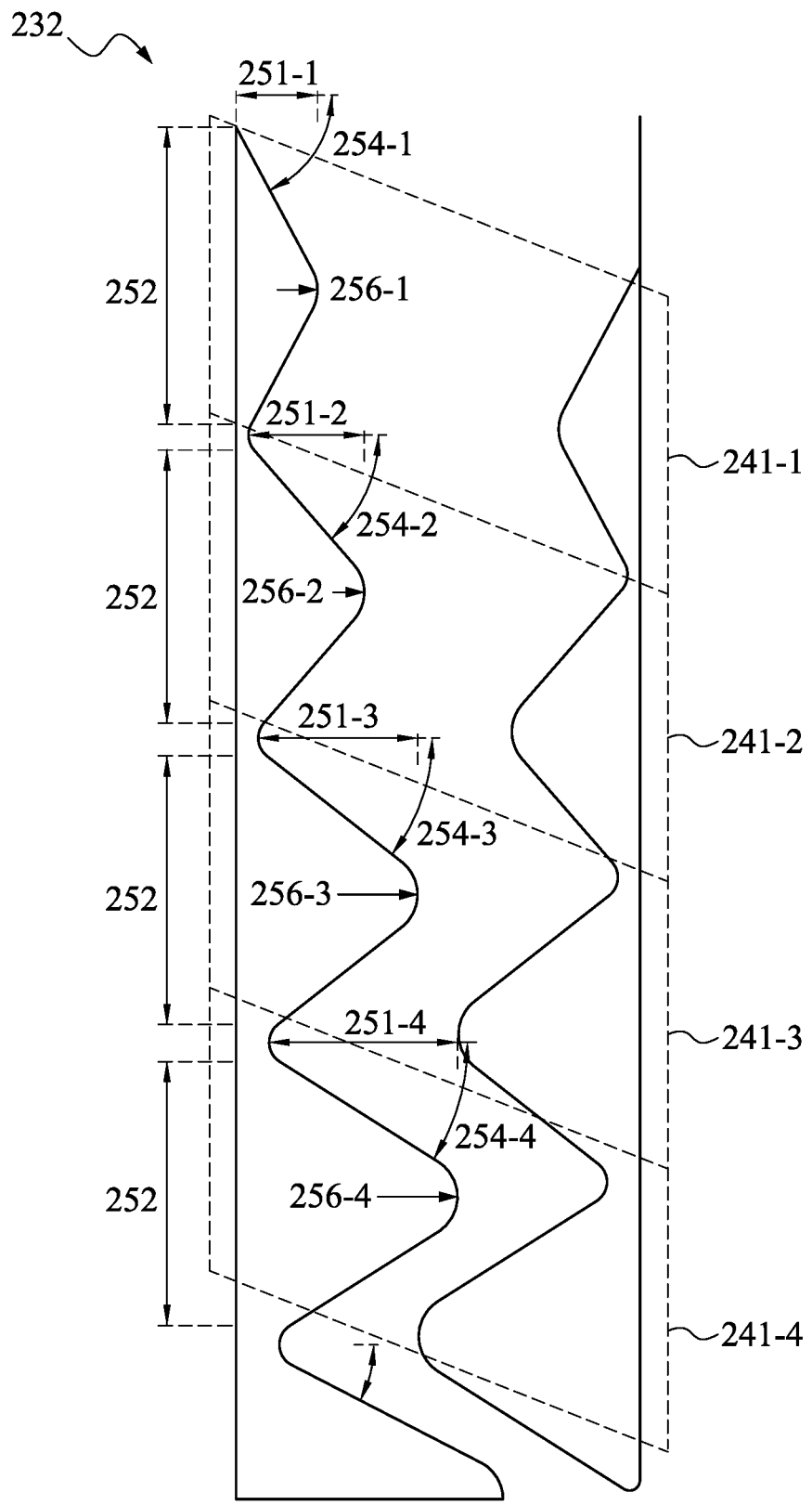
FIG. 2E illustrates a cross-sectional view of a nozzle head of a gas injector with a plurality of adaptors, in accordance with some embodiments of the present disclosure.

FIG. 2E illustrates a cross-sectional view of a nozzle head 232 of a gas injector 204 with a plurality of adaptors 242, in accordance with some embodiments of the present disclosure. In some embodiments, the nozzle head 232 comprises a plurality of adaptors 242 being placed in series along the body 240 of the nozzle head 232. The plurality of adaptors 242 each comprises two components with a component rotation angle 258 of 180 degrees, according to some embodiments. In some embodiments, the plurality of adaptors 242 can be a combination of adaptors with different side wall profiles in order to efficiently regulate the flow and, meanwhile, to minimize the deposit buildup and to maximize the dry cleaning efficiency. Specifically, FIG. 2E illustrates 4 adaptors 242-1, 242-2, 242-3 and 242-4. In some embodiments, the four adaptors 242 have a constant bottom width 252 and pitch distance 253. In some embodiments, the plurality of adaptors each may have a different geometric configuration. Specifically, the first set of adaptors 242-1 comprises a height 251-1, sidewall angle 254-1, and top curvature 256-1; the second set of adaptors 242-2 comprises a height 251-2, sidewall angle 254-2, and top curvature 256-2; the third set of adaptors 242-3 comprises a height 251-3, sidewall angle 254-3, and top curvature 256-3; and the fourth set of adaptors 242-4 comprises a height 251-4, sidewall angle 254-4, and top curvature 256-4.

Figure 2F:
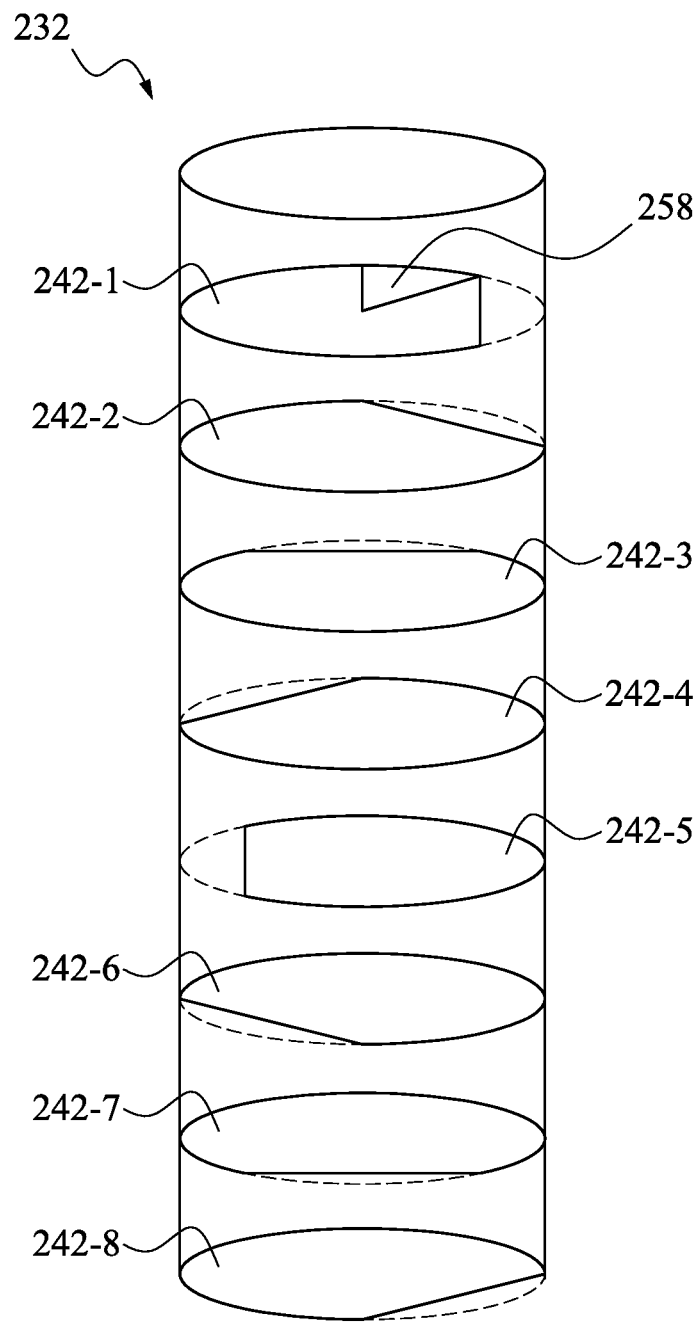
FIG. 2F illustrates a cross-sectional view of a nozzle head of a gas injector with a plurality of adaptors, in accordance with some embodiments of the present disclosure.
Figure 3A:
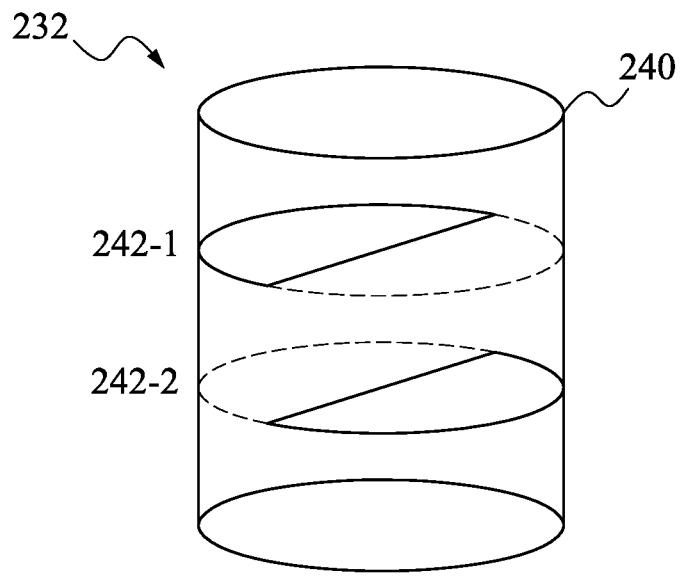
FIGS. 3A-3D illustrates cross-sectional views and top views of a nozzle head of a gas injector with a plurality of adaptors, in accordance with some embodiments of the present disclosure.
Figure 3A:
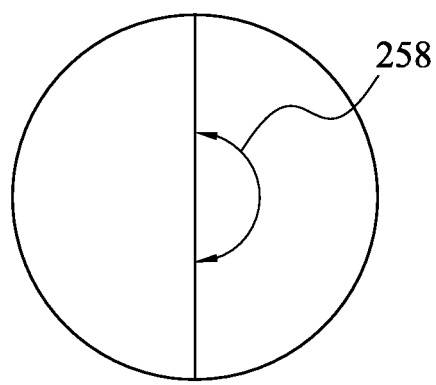
Figure 3B:
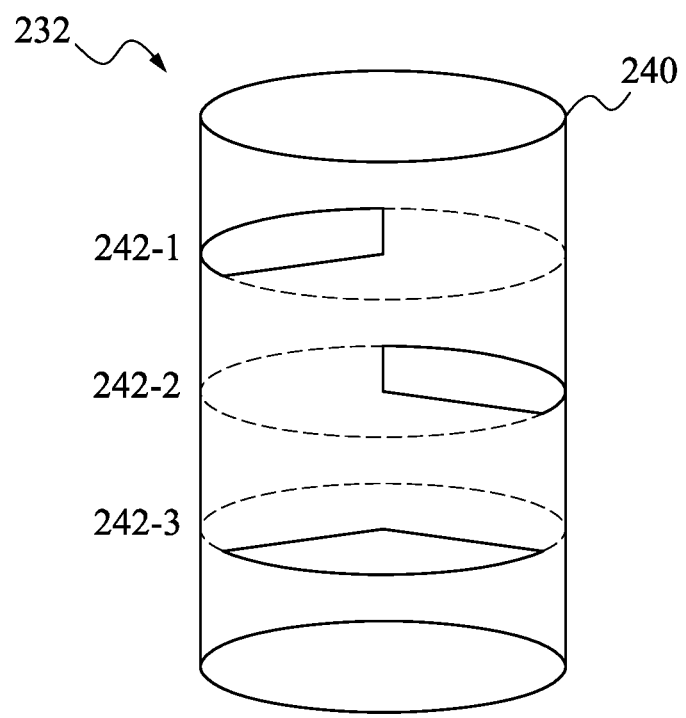
Figure 3B:
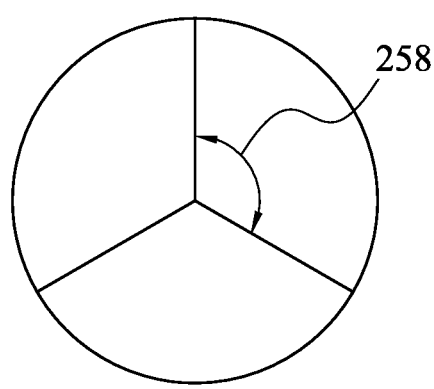
Figure 3C:
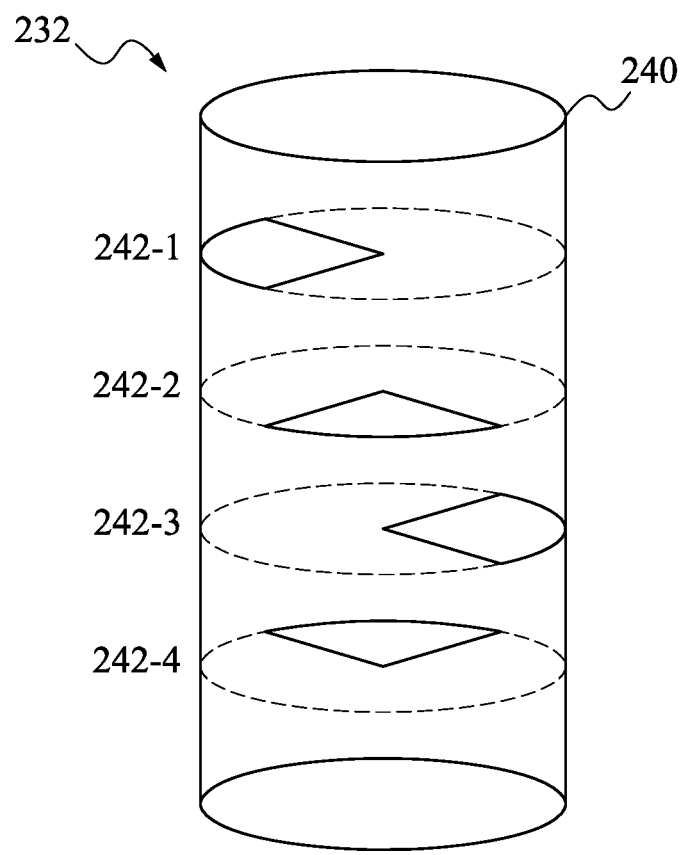
Figure 3C:
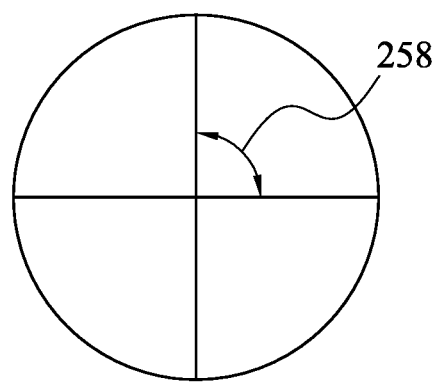
Figure 3D:
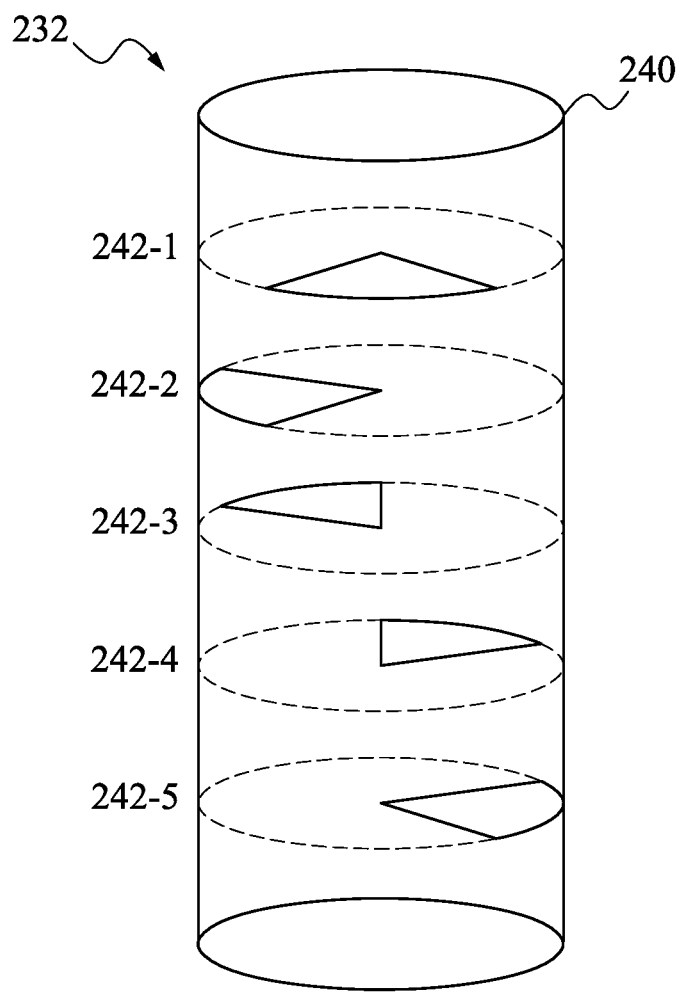
Figure 3D:
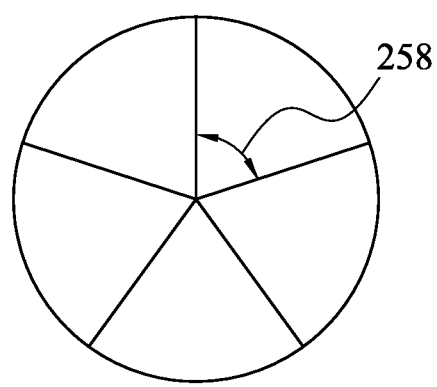

FIG. 2F illustrates a cross-sectional view of a nozzle head 232 of a gas injector 204 with a plurality of adaptors 242, in accordance with some embodiments of the present disclosure. In some embodiments, the nozzle head 232 may comprise a plurality of adaptors 242 (i.e., number of adaptors is N) being placed in series along the body 240 of the gas injector 204. In some embodiments, the four adaptors 242-1, 242-2, 242-3 and 242-4 may have a constant height 251, bottom width 252, pitch distance 253, sidewall angle 254, bottom curvature 255, and top curvature 256. The component rotation angle 258 is 45 degrees (i.e., 360/(2N)), in accordance with some embodiments.

Although the plurality of adaptors 242 in the illustrated embodiment of FIGS. 2E and 2F includes only four adaptors, it is understood that the embodiment of FIG. 2E is merely provided for illustration purposes. The plurality of adaptors 242 may include any desired number of adaptors 242 with any combination of geometric configurations (including height, bottom width, pitch size, sidewall angle, bottom curvature, top curvature, top width and component rotation angle) while remaining within the scope of the present disclosure.

FIGS. 3A-3D illustrate cross-sectional views and top views of a nozzle head 232 of a gas injector 204 with a plurality of adaptors 242, in accordance with some embodiments of the present disclosure. In some embodiments, the gas injector 204 may comprise a plurality of adaptors 242 being placed in series along the body 240 of the gas injector 204. The plurality of adaptors 242 each comprises a plurality of components (i.e., number of components equals N) with a component rotation angle 258 (i.e, 360/N), according to some embodiments. It is understood that the embodiment of FIG. 3A-3D is merely provided for illustration purposes. The plurality of adaptors 242 may include any desired number of components with any combination of geometric configurations (including height, bottom width, pitch size, sidewall angle, bottom curvature, top curvature, top width and component rotation angle) while remaining within the scope of the present disclosure.

Figure 4A:
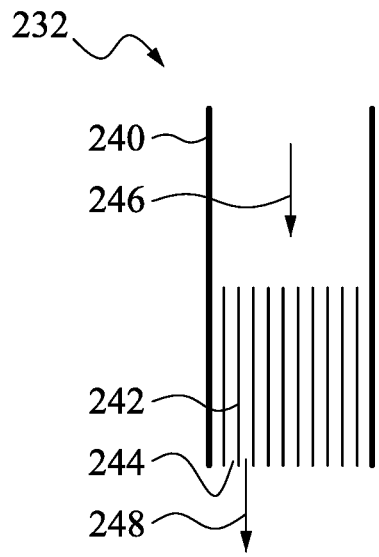
FIGS. 4A-4D illustrate cross-sectional views of nozzle heads of gas injectors with various adaptors, in accordance with some embodiment of the present disclosure.
Figure 4B:
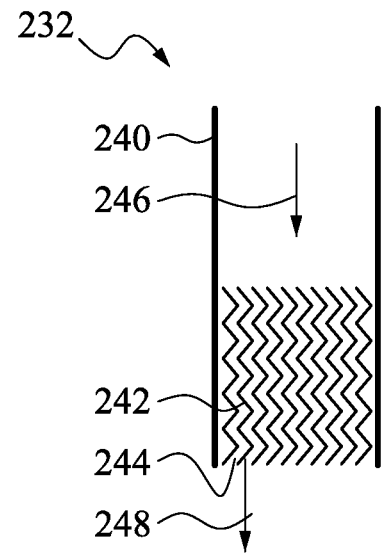
Figure 4C:
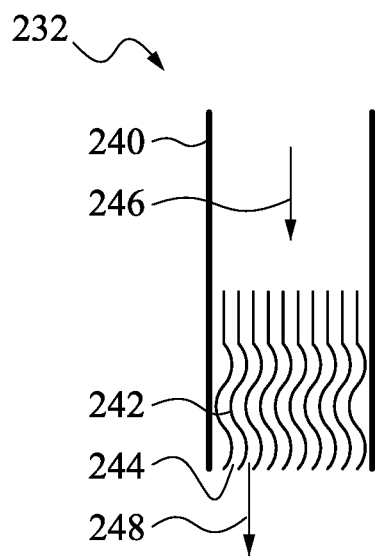
Figure 4D:
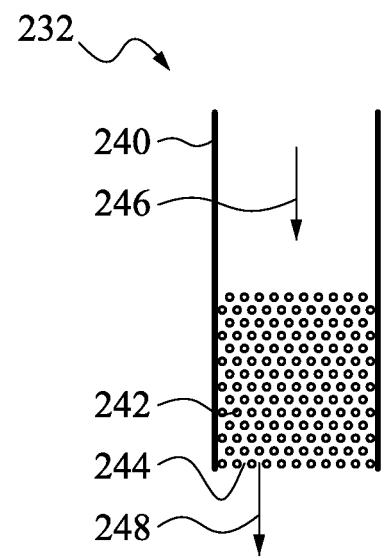

FIGS. 4A-4D illustrate cross-sectional views of a nozzle head 232 of a gas injector 204 with an adaptor 242, in accordance with some embodiment of the present disclosure. In some embodiments, the gas injector may comprise a plurality of components 242. Different from aforementioned examples in which components are normal to the primary flow 246 and the body 240, the plurality of components can be configured to divide the body 240 into a plurality of sub-channels, for example, vertical (FIG. 4A), zigzag (FIG. 4B), winding (FIG. 4C), etc. In some embodiments, the adaptor 240 may comprise irregular components which makes the adaptor porous (FIG. 4D). Size of the sub-channels or pores may vary from a few tens of micrometers to a few millimeters, in accordance with some embodiments. Adaptor configurations shown in FIGS. 4A-4D are for demonstration purposes and not intend to limit the present invention. It is clearly to a person with ordinary skill in the art that any type of sub-channels or porosity that an adaptor can provide and any combination thereof are within the scope of this invention.

Figure 5:
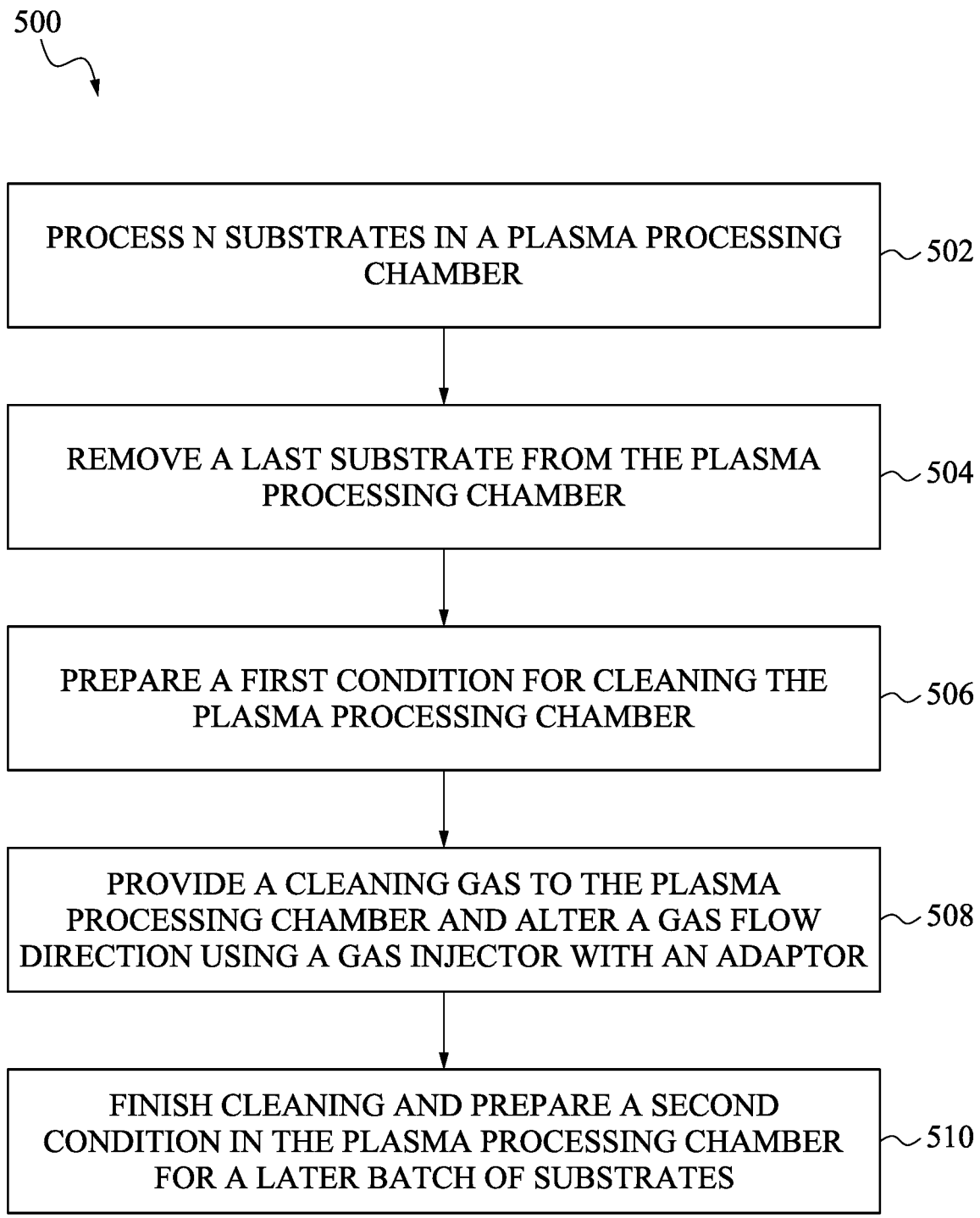
FIG. 5 illustrates a flow chart of a method for plasma processing on semiconductor substrates in a reaction chamber and dry cleaning of the reaction chamber, in accordance with some embodiments of the present disclosure.

FIG. 5 illustrates a flow chart of a method 500 for plasma processing on semiconductor substrates in a reaction chamber and dry cleaning of the reaction chamber, in accordance with some embodiments of the present disclosure. In some embodiments, the reaction chamber is used for deposition of Si or Si containing materials, e.g., Si, Si oxide, silicon nitride, metal silicide, and etc. In some embodiments, the reaction chamber is used for deep reactive etching in semiconductor substrates. It is understood that additional operations may be provided before, during, and after the method 500 of FIG. 5, and that some other operations may be omitted or only briefly described herein.

The method 500 starts with operation 502, wherein a plurality of semiconductor substrates can be provided into a reaction chamber for semiconductor processing. In order to improve manufacturing efficiencies and reduce production costs, the size of wafers steadily increased over the years. Standard silicon wafer sizes have steadily grown from about 200 mm (about 8 inches diameter) to 300 mm (about 12 inches diameter). The next generation wafer standard has been set for 450 mm (about 18 inches in diameter). The next generation wafer size of 450 mm has created a challenge in maintaining a uniform environment (e.g., temperature and reactant distribution) in the wafer stacks throughout the wafer boat during a CVD process that is desired to promote uniform material film deposition on a surface of each wafer. In some embodiments, the reaction chamber can be used for processing of large wafers (e.g. 12-18 inches). In some embodiments, the reaction chamber can be integrated with automated control systems and transfer mechanisms for loading and unloading wafers. The plurality of wafers can be processed together as a stack on a carrier (e.g., wafer boat) or processed individually, in accordance with some embodiments. In some embodiments, the reaction chamber can be a horizontal tube furnace, vertical tube furnace, a rotary tube furnace, a vacuum tube furnace, and can also be a reactor type of furnace with a larger reaction chamber.

The method 500 continues with operation 504, in which the plasma processing on the plurality of substrates is completed and a last semiconductor substrate is removed from the plasma processing chamber. The plurality of semiconductor substrates can be unloaded from the reaction chamber after the temperature changes from the reaction temperature to a threshold temperature in order to safely open the reaction chamber to transfer the plurality of semiconductor substrates to a next processing station or to a storage station. Temperatures of typical CVD processes may vary from about 200-800 degrees Celsius depending on the type of material to be deposited. In some embodiments, without intentional heating, temperatures on parts during a typical plasma dry etching may vary from about 200 degrees Celsius depending on the materials to be removed. In some embodiments, a cryogenic deep reactive ion etching requires the temperature controller to provide a chilled stage to −110 degrees Celsius. In some embodiments, the adaptor comprises materials that can be selected based on the operational temperature of the system.

The method 500 continues with operation 506 in which a cleaning condition in the plasma processing chamber is configured. In some embodiments, the cleaning condition comprises a pressure, a temperature profile on the wafer stage 208, flow rate of processing gases, a plasma power and time response of the temperature, etc. The pressure can be on the order of a few torr to minimize the loss of atomic reactants due to recombination at a higher pressure and to sustain the plasma. A temperature can be in a range of 200-500 degrees, in accordance with some embodiments. Particularly, the temperature can be adjusted based on the desired etching rate and the thickness of the film buildup. During this operation, the reaction chamber can be purged with inert gas to terminate the CVD deposition reaction for precise etching control.

The method 500 continues with operation 508 in which cleaning gas is provided to the plasma processing chamber and gas flow directions are altered by a gas injector. In some embodiments, the cleaning gas comprises at least one of the following argon, hydrogen, oxygen, sulfur fluoride, carbon fluoride, chlorine-containing gases, bromine-containing gases etc. Referring to FIG. 2A, the local computer 116 and the control unit 220 to create a first cleaning condition including plasma power, pressure, temperature, and reaction gases in the reaction chamber 202. In some embodiments, the cleaning gas can be provided to a remote plasma source that is coupled to reaction chamber 202 when the pressure and temperature conditions of the reaction chamber are satisfied. Remote plasma cleaning was designed to remedy the disadvantages of traditional RF plasma cleaning, which suffered from a number of deficiencies such as, for example, a slow etch rate, an inability to clean parts that are not in direct exposure to the plasma, sputter erosion from ion bombardment, and incomplete dissociation of reactant gas. In contrast to RF cleaning, remote plasma cleaning involves a purely chemical reaction rather than a combination of ion bombardment and chemically induced reactions. Therefore, some characteristic features of a remote plasma dry clean process include the production, transport and reaction rate of the active species. Referring to various embodiments illustrated in FIGS. 2-4, due to the configuration of a plurality of components in a plurality of adaptors 242 on the plurality of nozzle heads 232 in the gas injector 204, the gas flow direction, instead of directly through the body straight down to the reaction chamber (e.g., flow direction 246), is altered to a plurality of gas directions 248 by the adaptor 242. Film buildup 244 formed during the plasma processing can be confined to the bottom surface of the components facing the free space between the plasma cathode 203 and the wafer stage 208, and meanwhile, the formation of the film buildup on the inner surface of the body 240 of the nozzle heads 232 can be minimized. Similarly, due to the configuration of the plurality of components of the plurality of adaptor 242, the film buildup 244 can be removed by dry-cleaning plasma effectively so that the contamination from unsatisfactory removal of film buildup on the inner surface of the body 240 of the gas injector 204 during the later plasma processing on the semiconductor substrates can be minimized.

The method 500 further continues with operation 510, where a second condition in the plasma processing chamber is prepared for a later semiconductor processing. In some embodiments, an additional step to condition the inner chamber surface can be conducted before the loading of a next batch of wafers. It should be noted that various set-up and purge steps may also be included before or after any steps in the method 500.

In some embodiments, a gas injector for a semiconductor processing system includes a tube, and at least one nozzle head mounted on a downstream end of the tube wherein the at least one nozzle allows a fluid communication to discharge a gas from a upstream end of the tube through the at least one nozzle of the gas injector to ambient atmosphere surrounding the downstream end of the tube, wherein the at least one nozzle comprises: a body, and at least one adaptor comprising a plurality of flow regulation components to alter a flow direction of the gas at the downstream end, wherein the plurality of flow regulation components are each constructed and arranged such that a film buildup on inner surfaces of the gas injector is reduced.

In further embodiments, a plasma processing system includes a gas delivery system configured to provide at least one gas; a semiconductor processing chamber coupled to the gas delivery system; a gas injector configured to couple the gas delivery system and the semiconductor processing chamber, wherein the gas injector comprises a tube and at least one nozzle head mounted on a downstream end of the tube wherein the at least one nozzle allows a fluid communication to discharge a gas from a upstream end of the tube through the at least one nozzle of the gas injector to ambient atmosphere surrounding the downstream end of the tube, wherein the at least one nozzle comprises: a body, and at least one adaptor, wherein the adaptor comprises a plurality of flow regulation components to alter a flow direction of the gas at the downstream end, wherein the plurality of flow regulation components are arranged such that a film buildup on inner surfaces of the gas injector is reduced.

In yet further embodiments, a plasma processing method includes processing a plurality of semiconductor wafers in a semiconductor processing reaction chamber; altering a flow of gas within a gas injector so that the gas travels in a plurality of directions so as to reduce a film buildup on at least one inner surface of the gas injector; and performing a plasma-enhanced semiconductor process to clean a film buildup formed on the semiconductor processing reaction chamber and the gas injector.

While various embodiments of the invention have been described above, it should be understood that they have been presented by way of example only, and not by way of limitation. Likewise, the various diagrams may depict an example architectural or configuration, which are provided to enable persons of ordinary skill in the art to understand exemplary features and functions of the invention. Such persons would understand, however, that the invention is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations can be used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques.

To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure. In accordance with various embodiments, a processor, device, component, circuit, structure, machine, module, etc. can be configured to perform one or more of the functions described herein. The term "configured to" or "configured for" as used herein with respect to a specified operation or function refers to a processor, device, component, circuit, structure, machine, module, etc. that is physically constructed, programmed and/or arranged to perform the specified operation or function.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

If implemented in software, the functions can be stored as one or more instructions or code on a computer-readable medium. Thus, the steps of a method or algorithm disclosed herein can be implemented as software stored on a computer-readable medium. Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

Additionally, memory or other storage, as well as communication components, may be employed in embodiments of the invention. It will be appreciated that, for clarity purposes, the above description has described embodiments of the invention with reference to different functional units and processors. However, it will be apparent that any suitable distribution of functionality between different functional units, processing logic elements or domains may be used without detracting from the invention. For example, functionality illustrated to be performed by separate processing logic elements, or controllers, may be performed by the same processing logic element, or controller. Hence, references to specific functional units are only references to a suitable means for providing the described functionality, rather than indicative of a strict logical or physical structure or organization.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

What is claimed is:

1. A gas injector for a semiconductor processing system, comprising:
    a tube, and
    at least one nozzle mounted on a downstream end of the tube wherein the at least one nozzle allows a fluid communication to discharge a gas from a upstream end of the tube through the at least one nozzle of the gas injector to ambient atmosphere surrounding the downstream end of the tube, wherein the at least one nozzle comprises:
    a body, and
    at least one adaptor comprising a plurality of flow regulation components to alter a flow direction of the gas at the downstream end,
    wherein the plurality of flow regulation components each have different geometric configurations from each other such that a height and sidewall angle of each of the plurality of flow regulation components as measured from a sidewall of the at least one nozzle progressively increases toward a downstream end of the at least one nozzle.

2. The gas injector of claim 1, wherein the at least one adaptor is disposed inside the body of the at least one nozzle.

3. The gas injector of claim 2, wherein the plurality of flow regulation components is configured in series along the inner surface of the body.

4. The gas injector of claim 1, wherein each of the plurality of flow regulation components comprises a first surface and a second surface.

5. The gas injector of claim 4, wherein the first surface is configured facing a gas flow in the gas injector and the second surface is configured facing a wafer stage.

6. The gas injector of claim 4, wherein the film buildup is formed on the second surface of the plurality of flow regulation components of the at least one adaptor.

7. A plasma processing system, comprising:
a gas delivery system configured to provide at least one gas;
a semiconductor processing chamber coupled to the gas delivery system;
a gas injector configured to couple the gas delivery system and the semiconductor processing chamber, wherein the gas injector comprises a tube and at least one nozzle mounted on a downstream end of the tube wherein the at least one nozzle allows a fluid communication to discharge a gas from a upstream end of the tube through the at least one nozzle of the gas injector to ambient atmosphere surrounding the downstream end of the tube, wherein the at least one nozzle comprises: a body, and at least one adaptor, wherein the adaptor comprises a plurality of flow regulation components to alter a flow direction of the gas at the downstream end, wherein the plurality of flow regulation components each have different geometric configurations from each other such that a height and sidewall angle of each of the plurality of flow regulation components as measured from a sidewall of the at least one nozzle progressively increases toward a downstream end of the at least one nozzle.

8. The system of claim 7, wherein the at least one adaptor is disposed inside the body of the at least one nozzle.

9. The plasma processing system of claim 8, wherein the plurality of flow regulation components is configured in series along the inner surface of the body.

10. The system of claim 7, wherein each of the plurality of flow regulation components comprises a first surface and a second surface.

11. The system of claim 10, wherein the first surface is configured facing a gas flow in the body of the gas injector and the second surface is configured facing a wafer stage.

12. The system of claim 10, wherein the film buildup is formed on the second surface of the plurality of flow regulation components of the at least one adaptor.

13. A gas injector for a semiconductor processing system, comprising:
a tube, and
at least one nozzle mounted on a downstream end of the tube wherein the at least one nozzle allows a fluid communication to discharge a gas from a upstream end of the tube through the at least one nozzle of the gas injector to ambient atmosphere surrounding the downstream end of the tube, wherein the at least one nozzle comprises:
a body, and
at least one adaptor comprising a plurality of flow regulation components to alter a flow direction of the gas at the downstream end,
wherein the plurality of flow regulation components comprises a first flow regulation component having a first height, a first sidewall angle and a first top curvature, and a second flow regulation component having a second height larger than the first height, a second sidewall angle larger than the first sidewall angle and a second top curvature different from the first top curvature, wherein the second flow regulation component is downstream from the first flow regulation component and has a same width as the first flow regulation component.

14. The gas injector of claim 13, wherein the at least one adaptor is disposed inside the body of the at least one nozzle.

15. The gas injector of claim 14, wherein the plurality of flow regulation components is configured in series along the inner surface of the body.

16. The gas injector of claim 13, wherein each of the plurality of flow regulation components comprises a first surface and a second surface.

17. The gas injector of claim 16, wherein the first surface is configured facing the original gas flow in the gas injector and the second surface is configured facing a wafer stage.

18. The gas injector of claim 16, wherein the second surface is configured to hold a film buildup thereon.

* * * * *